(12) United States Patent  
Yoshimi

(10) Patent No.: US 7,418,553 B2
(45) Date of Patent: Aug. 26, 2008

(54) METHOD AND APPARATUS OF CONTROLLING ELECTRIC POWER FOR TRANSLATION LOOKASIDE BUFFER

(75) Inventor: Koichi Yoshimi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 193 days.

(21) Appl. No.: 11/077,148

(22) Filed: Mar. 11, 2005

(65) Prior Publication Data

US 2005/0160250 A1 Jul. 21, 2005

Related U.S. Application Data

(63) Continuation of application No. PCT/JP03/06359, filed on May 21, 2003.

(51) Int. Cl.
*G06F 12/00* (2006.01)
(52) U.S. Cl. ............... 711/133; 711/134; 711/154; 711/159; 711/207
(58) Field of Classification Search .............. None
See application file for complete search history.

(56) References Cited

U.S. PATENT DOCUMENTS

| 6,125,433 | A | * | 9/2000 | Horstmann et al. .......... 711/160 |
| 6,845,432 | B2 | * | 1/2005 | Maiyuran et al. ........... 711/154 |
| 2002/0049918 | A1 | | 4/2002 | Kaxirus et al. | |

FOREIGN PATENT DOCUMENTS

| EP | 1202287 | 5/2002 |
| JP | 56-35228 | 4/1981 |
| JP | 7-334423 | 12/1995 |
| JP | 9-204359 | 8/1997 |
| JP | 2000-148589 | 5/2000 |
| JP | 2002-182980 | 6/2002 |
| JP | 2003-45189 | 2/2003 |

OTHER PUBLICATIONS

Jung-Hi Min, et al., "A Selectively Accessing TLB for High Performance and Lower Power Consumption", Proceedings of the third Asia-Pacific Conference on ASICs, Aug. 6, 2002, pp. 45-48.
S. Borkar, "Design Challenge of technology scaling", IEEE Micro, 19, 4, 1999.
C.H. Kim, "Dynamic Vt SRAM: A Leakage Tolerant Cache Memory for Low Voltage Microprocessors", ISLPED02, Aug. 12-14, 2002.
S. Kaxiras, "Cache Decay: Exploiting Generational Behavior to Reduce Cache Leakage Power", ISCA, 2001.
Japanese Office Action mailed Nov. 1, 2005.

* cited by examiner

*Primary Examiner*—Reginald G. Bragdon
*Assistant Examiner*—Shawn X Gu
(74) *Attorney, Agent, or Firm*—Staas & Halsey LLP

(57) ABSTRACT

The present invention is intended to reduce unnecessary power consumption by controlling disconnection of entries unused in a translation lookaside buffer (TLB) for a long time. In an aspect of the present invention, there is provided a method of controlling electric power consumed for a translation lookaside buffer (TLB) within a central processing device having the TLB and an entry replacement mechanism wherein the TLB includes a plurality of entries and performs translation from a logical address to a physical address and the entry replacement mechanism replaces the entries of the TLB, the method including the steps of: selecting one or more entries among the plurality of entries of the TLB in accordance with one or more predefined criteria based on an output from the entry replacement mechanism, and controlling electric power supplied to the selected entries.

13 Claims, 10 Drawing Sheets

METHOD AND APPARATUS OF CONTROLLING ELECTRIC POWER FOR TRANSLATION LOOKASIDE BUFFER

CROSS-REFERENCE TO RELATED APPLICATIONS

The present application is a U.S. continuation application filed under 35 USC 111(a) claiming benefit under 35 USC 120 and 365(c) of PCT application JP03/06359 filed May 21, 2003, the contents of which are hereby incorporated herein by reference.

BACKGROUND OF THE INVENTION

1. Field of the Invention

The present invention generally relates to TLB (Translation Lookaside Buffer for translation from logical addresses to physical addresses) incorporated in a processor such as a central processing device, and more particularly, to reduction in electric power consumption for TLB.

2. Description of the Related Art

Recent development of high-speed processors (central processing devices) has promoted higher operation speed of transistor elements in the processors. The faster operation of a transistor element is achieved by lowering a threshold voltage (Vth) of the transistor element and thereby raising the current level (Ids) of the activated transistor element. When such transistors are used to design a processor, it is possible to drastically improve operation frequency of the processor.

However, if a transistor element has a lower threshold voltage (Vth) as noted above, the off-state leakage current may increase when the transistor element is off-state. That results in increases in electric power consumption during inactivation of the processor.

In particular, as disclosed in "Design challenges of technology scaling", IEEE Micro, 19, 4, 1999 presented by S. Borkar, a larger amount of static electric power would be consumed in a cache RAM within the processor during inactivation of the processor. Since an existing processor includes a large number of cache RAMs and a large area within the processor is occupied by the cache RAMs, it is estimated that the processor consumes an amount of power corresponding to about 5-10% of electric power for normal operation as static electric power, the amount of which tends to increase in future.

Also, some proposals to overcome the above problem have been presented. The article, which was written by C. H. Kim, "Dynamic Vt SRAM: A Leakage Tolerant Cache Memory for Low Voltage Microprocessors", ISLPED02, Aug. 12-14, 2002 discloses a method of lowering a leakage current by dynamically changing the threshold voltage (Vt) of a transisitor. "Cache Decay: Exploiting Generational Behavior to Reduce Cache Leakage Power", ISCA, 2001 discloses an approach to reduce power consumption by invalidating cache lines below a predefined frequency of use.

Moreover, some conventional techniques relating to the present invention are described in Japanese Laid-Open Patent Applications No. 07-334423, No. 56-035228B and No. 09-204359.

However, although TLB within a processor consumes electric power like cache RAMs, little attention on reduction in power consumption has been focused on TLB because of dominant seeking of speedup of TLB.

In TLB, CAM (Content Addressable Memory) includes high-speed circuits such as dynamic circuits. As a result, TLB consumes a large amount of electric power during normal operation as well as inactivation. Especially, TLB needs to include an additional extra charging circuit to eliminate some problems such as charge-sharing occurring in such a dynamic circuit in a comparator circuit within CAM. Thus, it is impossible to easily reduce electric power consumption during normal operation and inactivation.

In order to improve address translation performance of TLB, a larger number of entries are often provided within TLB. That increases an unnecessary amount of leakage current, resulting in further increases in power consumption.

SUMMARY OF THE INVENTION

In order to eliminate the above-mentioned problems, the present invention is intended to reduce unnecessary power consumption by controlling disconnection of entries unused in the TLB for a long time from power supply.

In order to achieve the above-mentioned objects, there is provided according to one aspect of the present invention a method of controlling electric power consumed for a translation lookaside buffer (TLB) within a central processing device having the TLB and an entry replacement mechanism wherein the TLB includes a plurality of entries and performs translation from a logical address to a physical address and the entry replacement mechanism replaces the entries of the TLB, the method including the steps of: selecting one or more entries among the plurality of entries of the TLB in accordance with one or more predefined criteria based on an output from the entry replacement mechanism, and controlling electric power supplied to the selected entries.

According to one aspect of the present invention, in order to reduce electric power consumed for TLB during inactivation, the power consumption is controlled by using an entry replacement mechanism required for the TLB by nature, selecting a plurality of certain entries as candidates to reduce power consumption, and disconnecting CAM/RAM parts of unused entries of the TLB from power supply.

In this manner, since such unused TLB entries can be powered OFF, it is possible to reduce power consumption due to unnecessary leakage current.

Other objects, features and advantages of the present invention will become more apparent from the following detailed description when read in conjunction with the accompanying drawings.

DETAILED DESCRIPTION OF THE PREFERRED EMBODIMENTS

In the following, embodiments of the present invention will be described in conjunction of the drawings.

At the beginning, an exemplary fundamental operation of TLB will be described with reference to FIG. 1 through FIG. 4.

Figure 1:
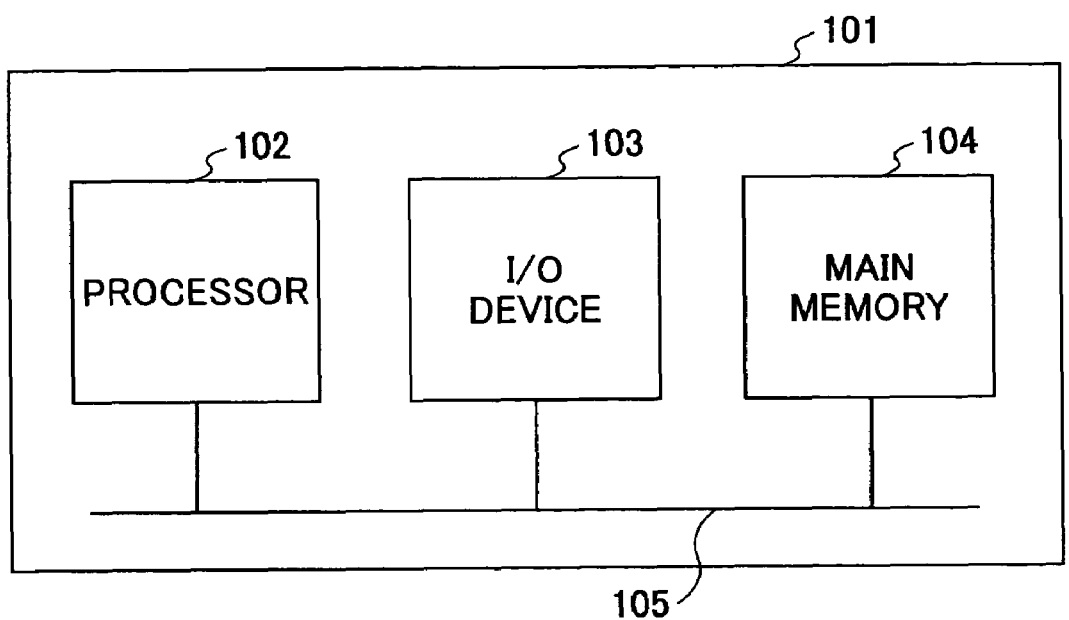
FIG. 1 is a block diagram roughly illustrating a typical computer system.

FIG. 1 is a block diagram roughly illustrating a typical computer system. Referring to FIG. 1, a typical computer system 101 includes a processor 102 as a central processing unit, an input/output (I/O) device 103 such as a keyboard and a monitor, a main memory 104 for storing data and programs and a bus 105 for connecting among the processors 102, the I/O device 103 and the main memory 104.

Figure 2:
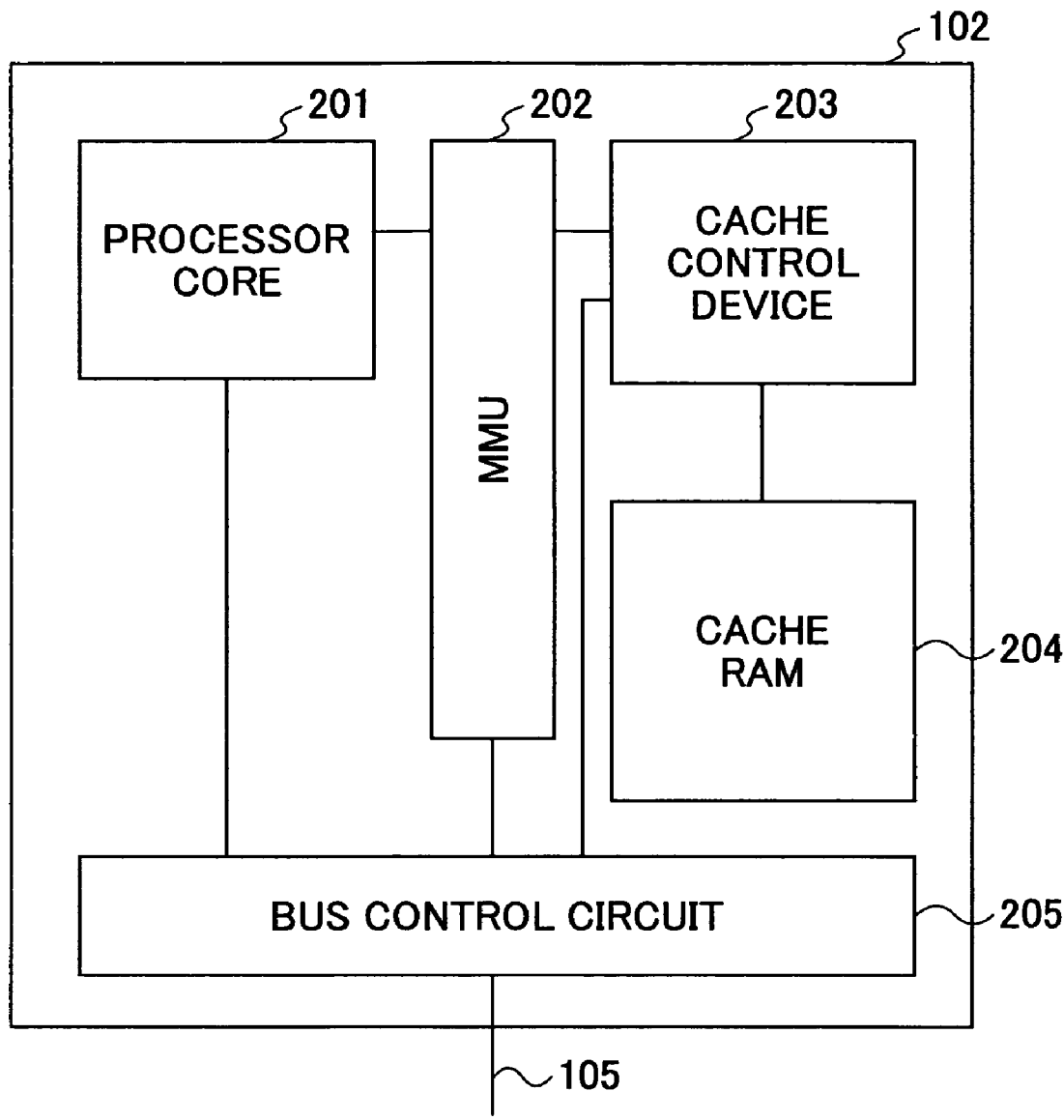
FIG. 2 is a block diagram roughly illustrating an exemplary internal structure of a processor of FIG. 1.

FIG. 2 is a block diagram roughly illustrating an exemplary internal structure of the processor 102 of FIG. 1. Referring to FIG. 2, the processor 102 includes a processor core 201, a memory management unit (MMU) 202, a cache control device 203, a cache RAM 204 and a bus control circuit 205.

Figure 3:
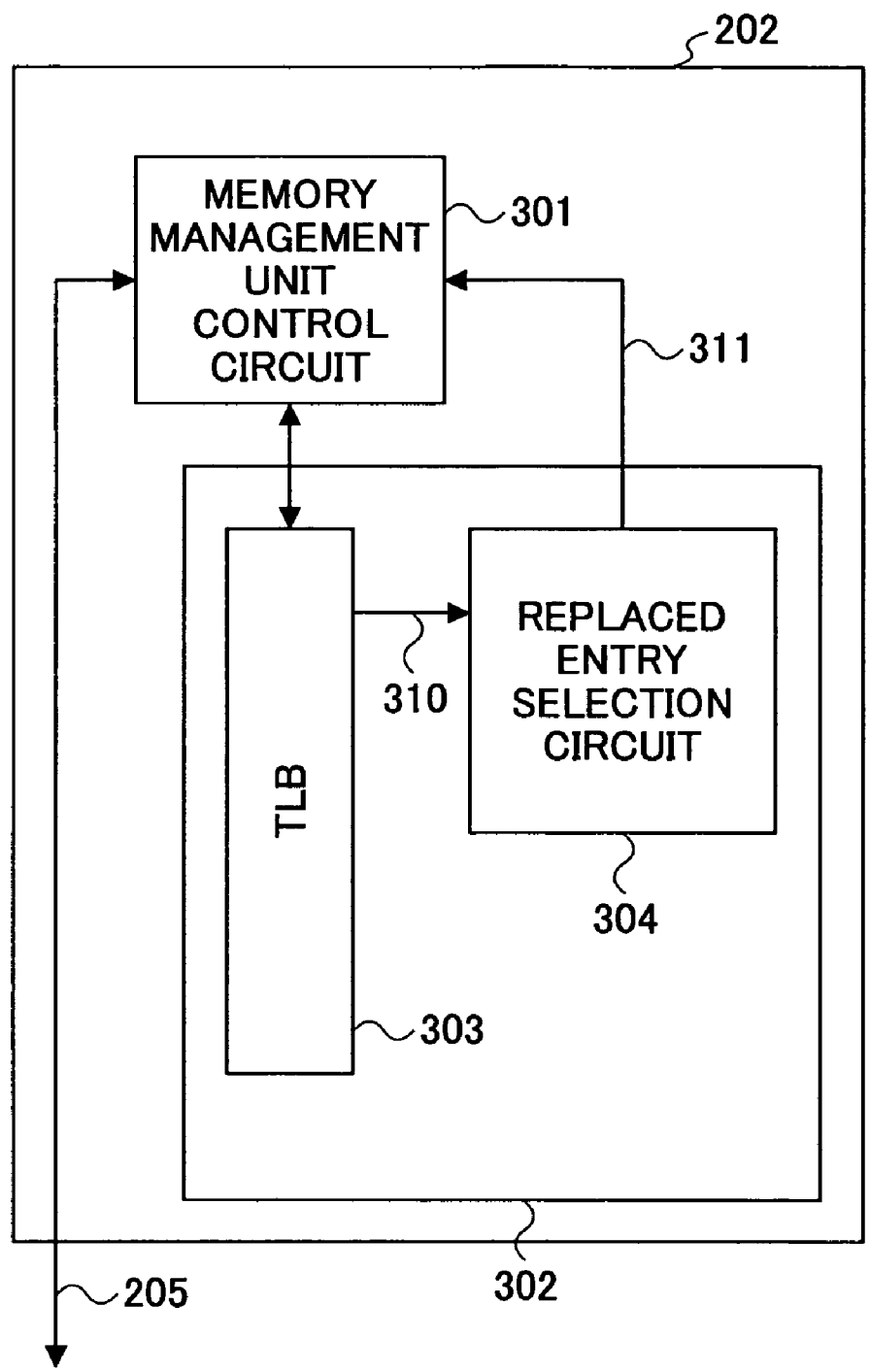
FIG. 3 illustrates a conventional memory management unit.

FIG. 3 illustrates a conventional memory management unit 202. Referring to FIG. 3, the memory management unit 202 includes a memory management unit control circuit 301 and a TLB function part 302. The TLB function part 302 includes TLB 303 and a replaced entry selection circuit 304 as an entry replacement mechanism.

Figure 4:
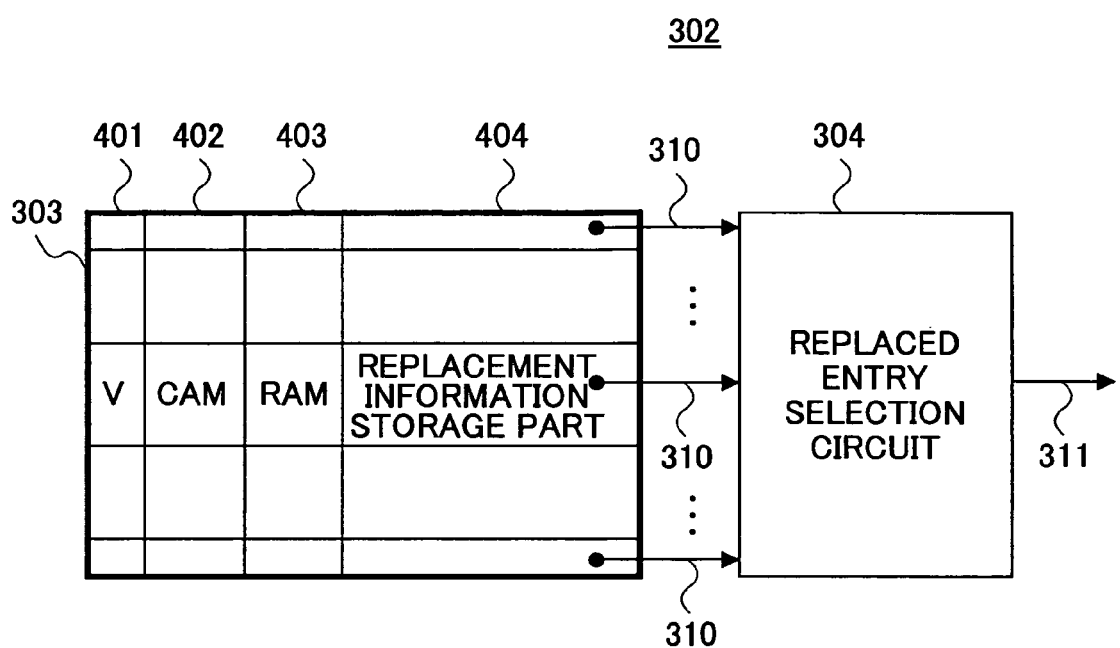
FIG. 4 is a block diagram illustrating an exemplary structure of a TLB function part.

FIG. 4 is a block diagram illustrating an exemplary structure of the TLB function part 302. Referring to FIG. 4, the TLB function part 302 includes TLB 303 and a replaced entry selection circuit 304. The TLB 303 of FIG. 4 includes a plurality of entries, in this example, M entries. Each entry includes a validbit part 401, a CAM part 402, a RAM part 403 and a replacement information storage part 404. The validbit part 401 stores information indicative of validity of the entry. The CAM part 402 stores virtual address information. The RAM part 403 stores physical address information.

Basically, in response to an incoming virtual address from the memory management unit control circuit 301 of FIG. 3, TLB 303 retrieves an physical address from the RAM part 403 of a relevant entry, of which CAM part 402 stores the incoming virtual address and validbit part 401 is set to be valid, and supplies the retrieved physical address to the memory management unit control circuit 301 of FIG. 3.

On the other hand, recently used addresses and physical addresses corresponding to the virtual addresses are stored in TLB 303. Thus, an entry of TLB 303 may be rewritten as the most recently used virtual address and the corresponding physical address in accordance with a predefined algorithm. The replaced entry selection circuit 304 is responsible for this task. The replaced entry selection circuit 304 reads replacement information from the replacement information storage part 404 within TLB 303. Based on the replacement information, the replaced entry selection circuit 304 then determines which entry should store the most recently used virtual address and the corresponding physical address, and informs the memory management unit control circuit 301 of FIG. 3 of the determined entry.

Then, the memory management unit control circuit 301 writes the most recently used virtual address and the corresponding physical address in the entry of TLB 303 specified by the replaced entry selection circuit 304. In this way, the entry of TLB 303 has been replaced.

For example, entry random selection algorithm and LRU (Least Recently Used) algorithm are known as such an algorithm adopted for the replaced entry selection circuit 304 to select an entry to be replaced. The entry random selection algorithm randomly selects one entry to be replaced. On the other hand, LRU algorithm, when one entry of TLB must be replaced, selects the least recently used (accessed) entry as the entry to be replaced.

For example, for each entry, the replacement information storage part 404 stores reference (access) information indicating that the entry has been referred to. For each entry, the replaced entry selection circuit 304 reads reference information regarding the entry from the replacement information storage part 404, and selects the least recently accessed entry as an entry to be replaced by comparing the reference information on individual entries. Then, the replaced entry selection circuit 304 supplies identification of the selected entry, such as its entry number, to the memory management unit control circuit 301. Based on the identification of the selected entry, the memory management unit control circuit 301 controls replacement of the entry of TLB.

Figure 5:
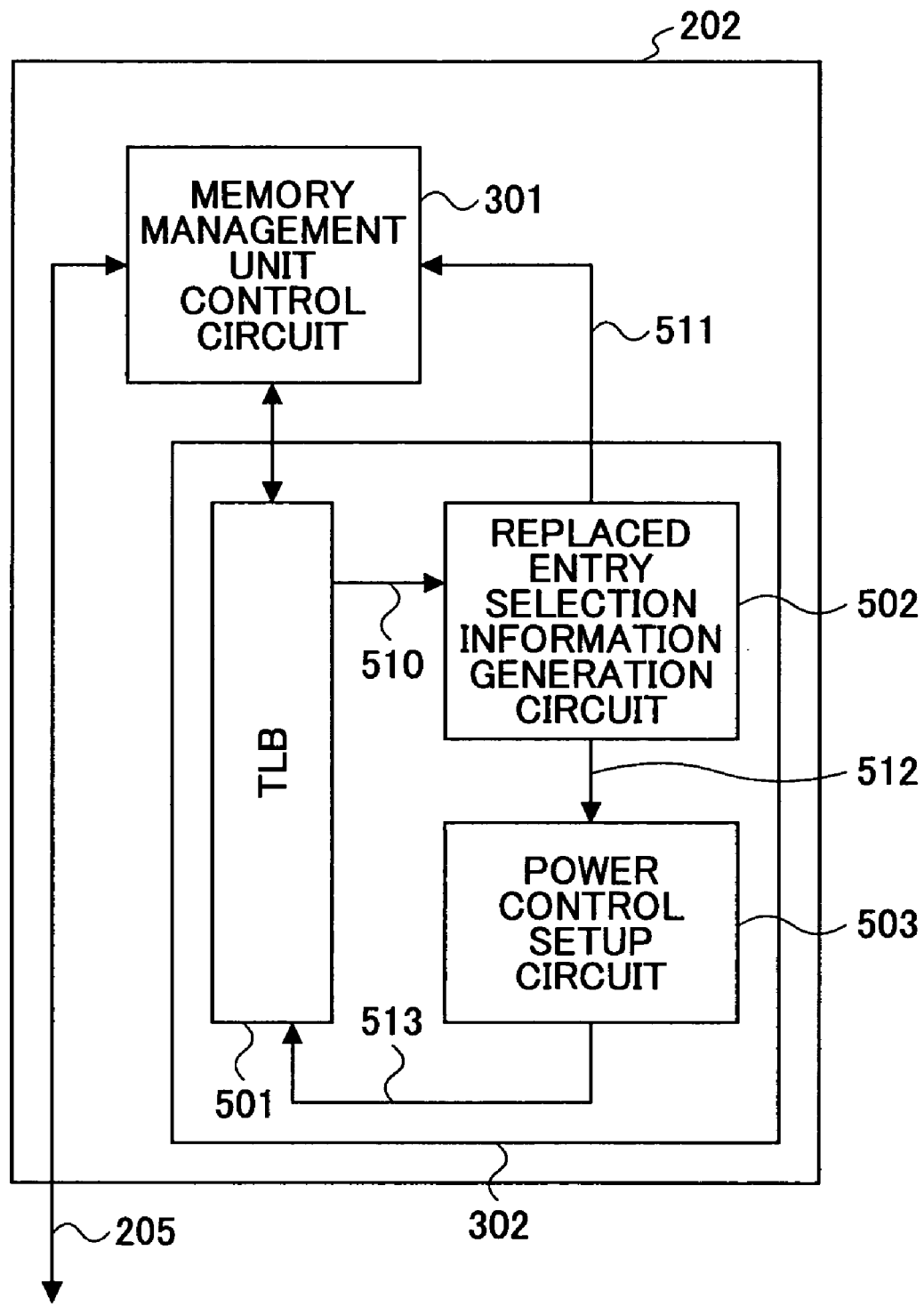
FIG. 5 is a block diagram illustrating a memory management unit according to one embodiment of the present invention.

Next, one embodiment of the present invention will be described. FIG. 5 is a block diagram illustrating a memory management unit 202 according to one embodiment of the present invention. Referring to FIG. 5, the memory management unit 202 includes a memory management unit control circuit 301 and a TLB function part 302. The TLB function part 302 includes TLB 501, a replaced entry selection information generation circuit 502 as an entry selection part and a power control setup circuit 503 as a portion of a power control part.

Figure 6:
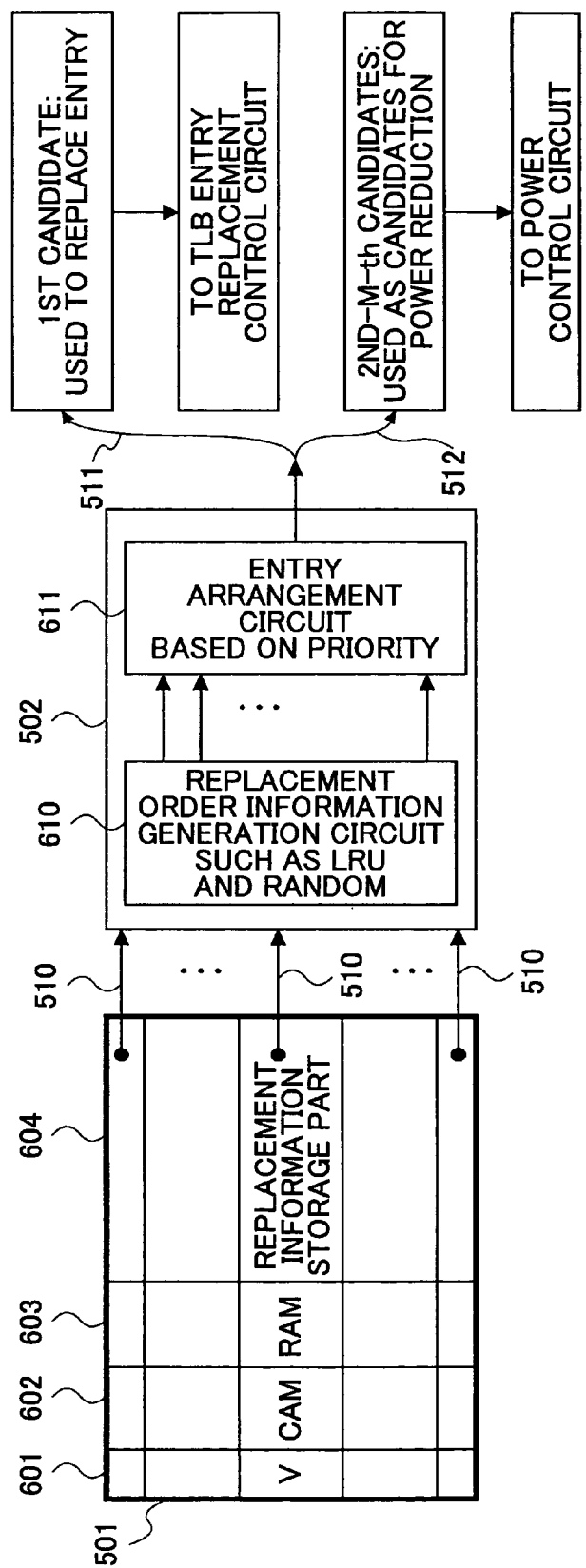
FIG. 6 is a block diagram illustrating exemplary structures of a TLB function part, TLB and a replaced entry selection information generation circuit according to one embodiment of the present invention.

FIG. 6 is a block diagram illustrating exemplary structures of TLB 501 and the replaced entry selection information generation circuit 502 of the TLB function part 302 according to one embodiment of the present invention. Referring to FIG. 6, TLB 501 includes a plurality of entries, in this embodiment, M entries. Each entry includes a validbit part 601, a CAM part 602, a RAM part 603 and a replacement information storage part 604. The validbit part 601 stores information indicative of validity of the entry. The CAM part 602 stores virtual address information. The RAM part 603 stores physical address information.

Similarly to the fundamental operation described with reference to FIG. 4, in response to an incoming virtual address from the memory management unit control circuit 301 of FIG. 5, TLB 501 retrieves an physical address from the RAM part 603 of an entry, of which CAM part 602 stores the incoming virtual address and validbit part 601 is valid, and supplies the retrieved physical address to the memory management unit control circuit 301 of FIG. 5.

Next, an exemplary operation of the replaced entry selection information generation circuit 502 will be described. In this embodiment, the replaced entry selection information generation circuit 502 includes a replacement order information generation circuit 610 and an entry arrangement circuit 611. The replacement order information generation circuit 610 generates replacement order information for each entry in accordance with the above-mentioned entry random selection algorithm or LRU algorithm. The entry arrangement circuit 611 sorts entries based on the replacement order information generated by the replacement order information generation circuit 610, and presents the first candidate and the second to the M-th candidates. Similarly to the manner described with reference to FIG. 4, the replaced entry selection information generation circuit 502 uses the replacement order information generation circuit 610 and the entry arrangement circuit 611 to read replacement information from the replacement information storage part 604 of TLB 510. Based on the retrieved replacement information, the replaced entry selection information generation circuit 502 then determines one entry as the first candidate entry to write the most recently used virtual address and the corresponding physical address, and sends the determined entry to the memory management unit control circuit 301 of FIG. 5 via a signal 511. At the same time, the replaced entry selection information generation circuit 502 of FIG. 6 selects the second through the M-th candidates as entries having a potential of reducing electric power, and maintains these candidates as replaced entry selection order information 512.

The replaced entry selection information generation circuit 502 can use the above-mentioned entry random selection algorithm or LRU algorithm to generate the replaced entry selection order information 512 for reference to candidates to be replaced in terms of their power consumption reduction effect.

After the first candidate entry has been selected, the entry random selection algorithm randomly determines any entries corresponding to the second through the M-th entries as the replaced entry selection order information. On the other hand, in case of LRU algorithm, the replaced entry selection information generation circuit 502 reads reference information indicating that the entries have been referred to in the replacement information storage part 604 thereof, and determines the second through the M-th entries as the replaced entry selection order information 512 based on the reference information on these entries. In this way, the replaced entry selection information generation circuit 502 uses LRU algorithm to determine the replaced entry selection order information 512 in the least recently accessing order.

Figure 7:
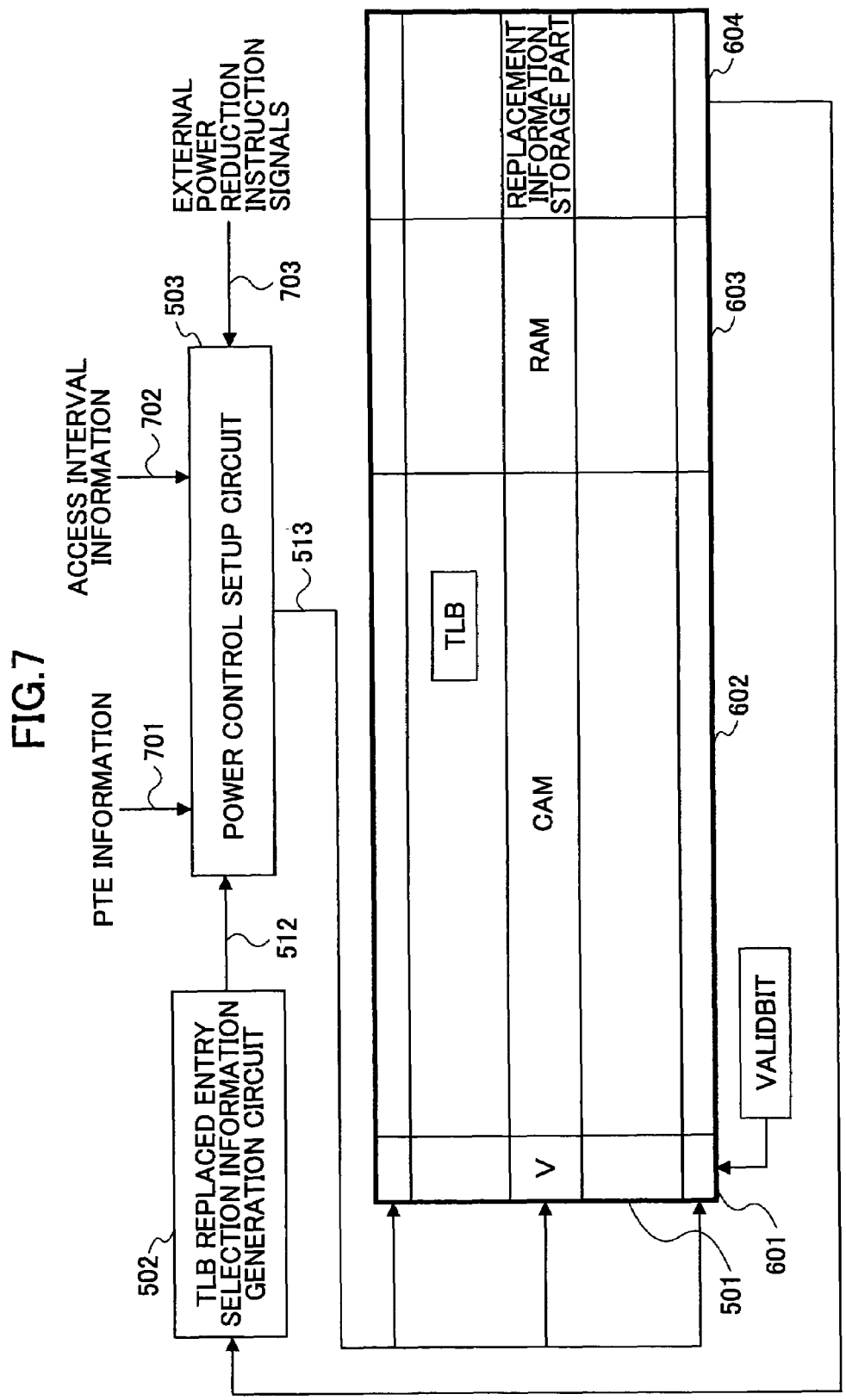
FIG. 7 is a diagram illustrating TLB, a replaced entry selection information generation circuit and a power control setup circuit.

FIG. 7 illustrates TLB 501, the replaced entry selection information generation circuit 502 and the power control setup circuit 503. The replaced entry selection order information 512, which indicates the second through the M-th entries in the replacement candidate order, is sent from the replaced entry selection information generation circuit 502 to the power control setup circuit 503. Then, the power control setup circuit 503 receives PTE information 701 (priority level information for maintaining entries to an address translation table specified in unit of process performed by a central processing device), access interval information 702 (access interval information to the address translation table), an external power reduction instruction signal and others.

The power control setup circuit 503 sends a power control signal 513 to relevant entries of TLB 501 in accordance with the replaced entry selection order information 512 with reference to the PTE information 701, the access interval information 702, the external power reduction instruction signal 703 (control information to select the second through the n-th entries based on the replacement order information on a plurality of entries), size information of memory pages in use of the central processing device and others.

Figure 8:
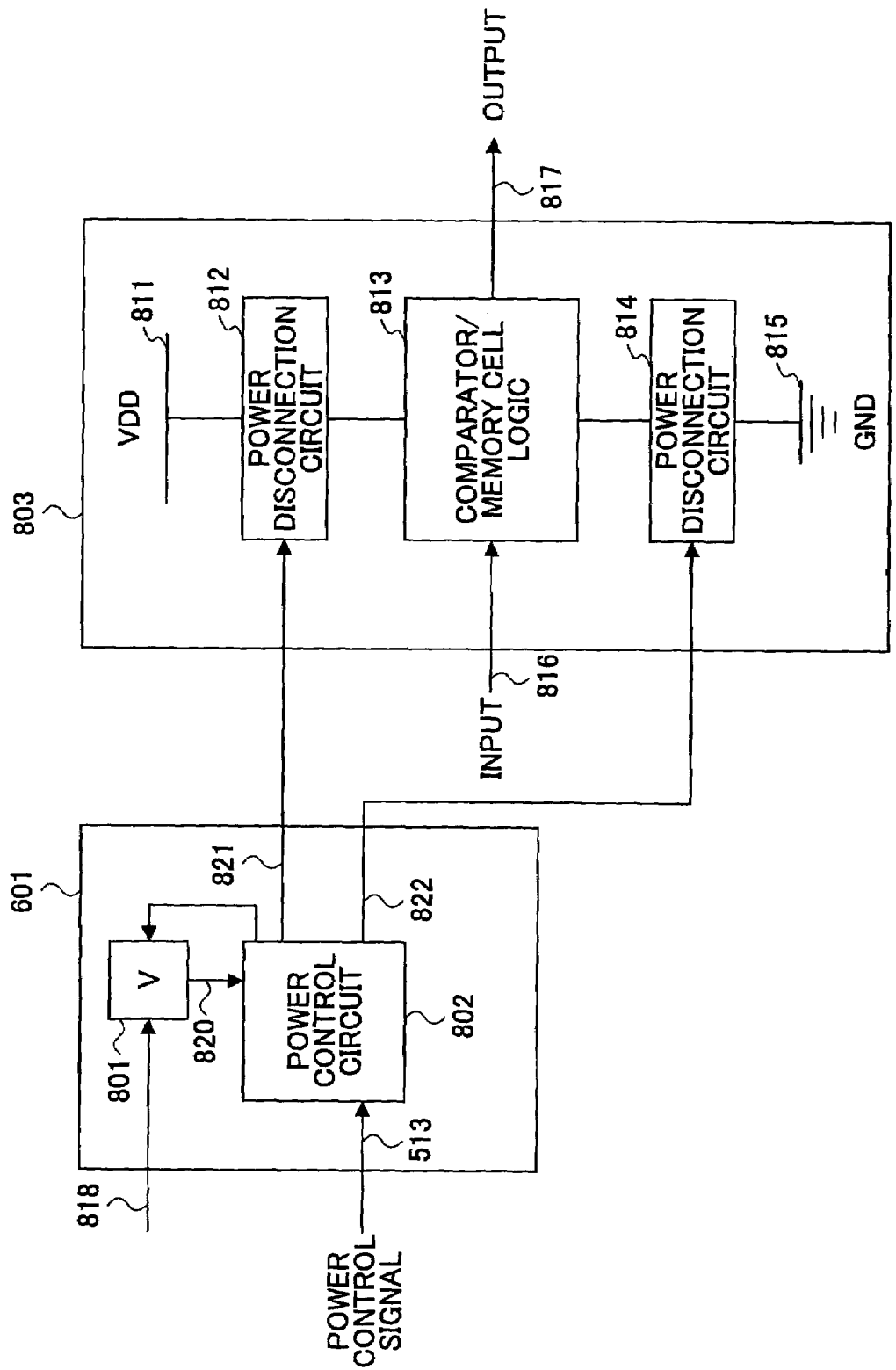
FIG. 8 is a diagram illustrating exemplary structures of a validbit part and a one-bit cell of a CAM part and a RAM part of an entry of TLB of FIG. 6.

FIG. 8 illustrates exemplary structures of a validbit part 601 and a one-bit cell 803 of a CAM part 602 and a RAM part 603 of one entry of TLB 501 of FIG. 6. The validbit part 601 includes a memory 801 for storing a valid bit and a power control circuit 802 as a portion of the power control part. The one-bit cell 803 includes a power supply (VDD) 811, a power supply disconnection circuit 812 as a portion of the power control part, a comparator/memory cell logic 813, a power supply disconnection circuit 814 and a ground (GND) 815. For each entry, one validbit part 601 is provided. The power supply disconnection circuits 812 and 814 include transistors having a high threshold. Each entry is provided with a number of one-bit cells 803 corresponding to the total number of bits of the CAM part 602 and the RAM part 603 of the entry. In TLB 501 according to this embodiment of the present invention, each memory cell of the CAM part 602 and the RAM part 603 is provided with the power supply disconnection circuits 812 and 814 for controlling electric power.

On the other hand, since the validbit part 601 and the replacement information storage part 604 of FIG. 6 are used for replacement and power control, the power supply disconnection circuits 812 and 814 are not provided to the validbit part 601 and the replacement information storage part 604 so that electric power can be always supplied to the validbit part 601 and the replacement information storage part 604.

An input to the memory 801 and an input 816 and an output 817 to/from the comparator/memory cell logic 813 are coupled to the memory management unit control circuit 301 of FIG. 5, and are controlled by the memory management unit control circuit 301.

A valid bit stored in the memory 801 and a power control signal 513 supplied from the power control setup circuit 503 are supplied to the power control circuit 802 within the validbit part 601.

If a validbit 820 from the memory 801 indicates to be invalid, it can be concluded that the entry is unused. Thus, the power control circuit 802 enables (disconnects) the power supply disconnection circuit 812 and 814 to stop electric power supplied to the comparator/memory cell logic 813 in order to reduce power consumption.

On the other hand, if the validbit 820 from the memory 801 indicates to be valid, the power control circuit 802 considers the whole entry to be valid, and supplies electric power to the comparator/memory cell logic 813 of the entry without enabling the power supply disconnection circuit 812 and 814.

However, even in case of the validbit 820 from the memory 801 being valid, if the power control information 513 indicates that comparator/memory cell logic should be disconnected from power supply, the power control circuit 802 enables the power supply disconnection circuits 812 and 814 to stop supplying electric power to the comparators/memory cell logic 813 in order to reduce power consumption. In this case, the validbit is also invalidated.

While the replaced entry selection information generation circuit 502 provides the order of the second through the n-th candidates selected as candidates to be replaced, the power control setup circuit 503 determines what extent of electric power should be actually controlled based on the order information.

Next, an exemplary method of generating a power control signal by the power control setup circuit 503 will be described.

Figure 9:
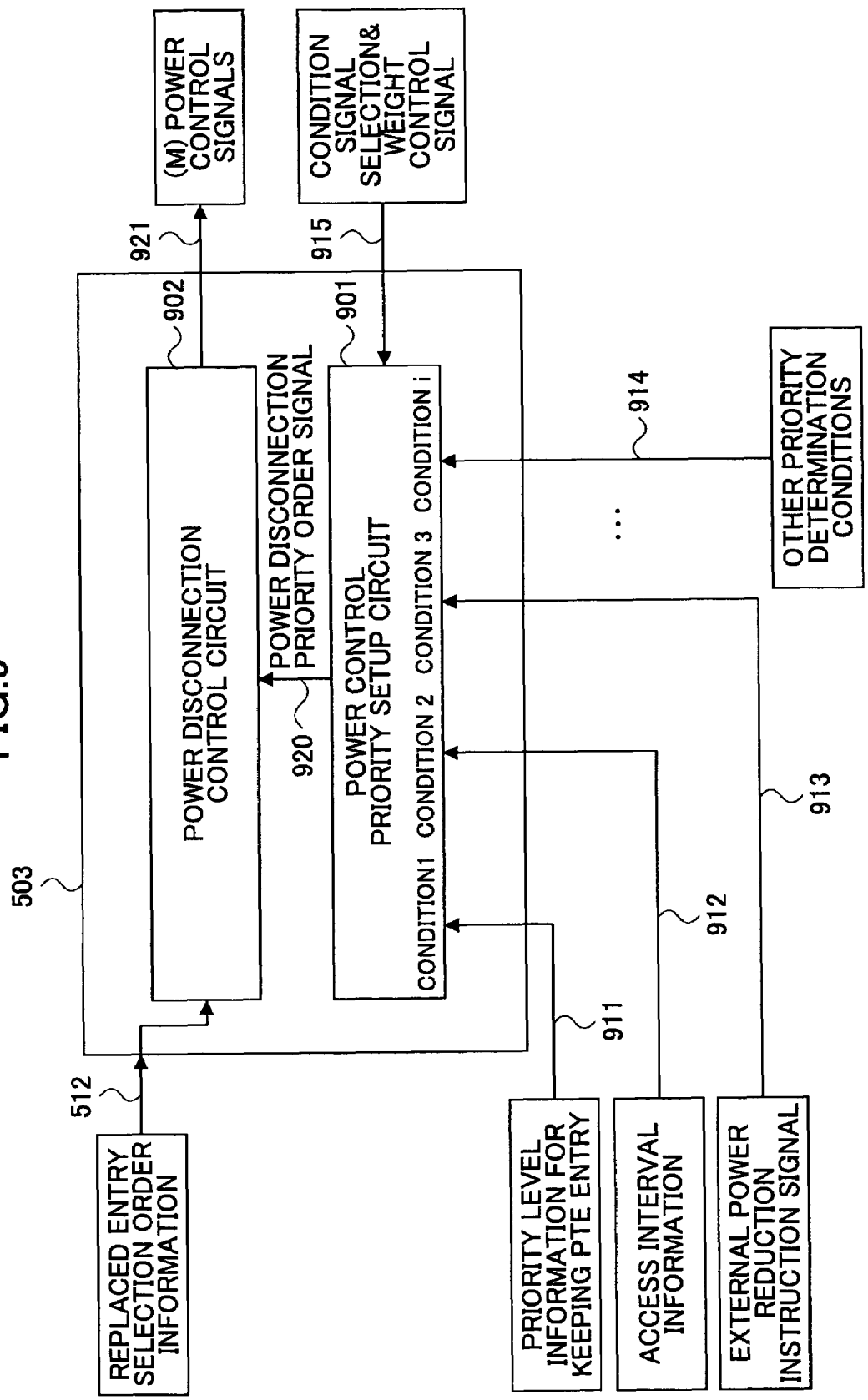
FIG. 9 is a diagram illustrating an embodiment of a power control setup circuit.

FIG. 9 illustrates one embodiment of the power control setup circuit 503. Referring to FIG. 9, the power control setup circuit 503 includes a power control priority setup circuit 901 and a power disconnection control circuit 902. The power control priority setup circuit 901 receives a signal used as criteria to determine power control priority for each entry.

The received signal includes:
(Condition 1): priority level information kept in PTE (Page Table Entry: address translation table) entry specified in unit of process;
(Condition 2): access interval information (access interval information to the address translation table);
(Condition 3): an external power reduction instruction signal;
(Condition 4): the page size in use for the central processing device;

(Condition 5): entry replacement order information; and
(Condition 6): a plurality of instruction signals indicating what extent of power supply is dynamically disconnected.

Also, for each selection condition, selectivity information indicating whether to select the condition (selectivity information to determine what information is used as predefined criteria to select entries) and weight information 915 for weighting at selection time are additionally supplied.

The selectivity information and the weight information are used, for example, to control (1) whether to adopt a selection condition, or (2) if the selection condition is adopted, what weight the condition is assigned.

For example, if the above-mentioned two conditions: (Condition 1): the priority level information kept in PTE entry and (Condition 2): the access interval information are received, the priority between the two conditions is defined based on weights assigned to the conditions.

For example, suppose that an entry is set not to be used as a power reduction candidate based on the priority level information kept in PTE. Also, suppose that the entry has not been replaced but can be estimated not to be accessed for a long time based on the access interval information.

For such an entry, the above-mentioned weight information is used to determine which of the priority level information and the access interval information has higher priority.

With reference to the information 915, it is finally determined which candidate(s) should be power-controlled among the second through the n-th candidates, and a power control signal is supplied based on the determination.

The above-mentioned input signal is used to make determination as follows.

The priority level information is maintained within PTE (Page Table Entry) used as input entry information on TLB, and is used as power control information. The priority level information indicates whether or not to control electric power. For a frequently used memory page, if the entry is evicted by power-controlling the memory page, the performance reduction may occur. Thus, similarly to the above-mentioned case of page size, the priority level information is maintained as measures for preventing power control.

The access interval information indicates an access interval of a certain TLB entry. A large access interval means that the physical address space specified in the TLB has not been accessed for a long time and that electric power is wasted for the TLB entry. Thus, it is possible to reduce power consumption by invalidating such an entry having long access interval by priority.

The external power reduction instruction signal instructs reduction of electric power from the external side. The external power reduction instruction signal is a control signal, for example, for always interrupting electric power supplied to a predetermined portion of TLB entries. The external power reduction instruction signal can be set in software or hardware. For example, the external power reduction instruction signal may be used to save electric power by interrupting electric power supplied to a predefined portion of TLB entries in power saving mode. Alternatively, the external power reduction instruction signal may be a control signal for preventing interruption of electric power to a certain entry. In this case, it is possible to avoid performance reduction by preventing interruption of electric power supplied to a predefined portion of TLB entries.

Concerning the page size, in case of continuously accessing data having a large page size, there is a higher possibility that the use of the entry may continue. Thus, when the entry is evicted due to execution of power control, more TLB entries may be registered again, resulting in performance reduction. In order to maintain the performance by refraining power control, this information is used.

Concerning entry replacement order information, there are various methods of selecting candidates to be replaced from TLB entries, such as the above-mentioned LRU method and random replacement method. Although any method may be used, the entry replacement order information is extended to produce order information on the first through the n-th candidates, and the order information is used as selection information. For example, in LRU method, the first candidate becomes a replaced entry candidate, and the second through the n-th candidates become candidate to be power-controlled. Depending on adopted methods, selected candidates can be weighted by attaching additional information, as needed.

For a plurality of instruction signals to indicate what extent of power supply is dynamically disconnected, for example, if LRU method is used as the replacement method, the first through the n-th candidates are sorted as candidates to be replaced, and the order of candidates to be power-controlled is produced in accordance with LRU method. When electric power supplied to all of the second through the n-th candidates is stopped, there arises a risk that as far as LRU entries required for translation may be interrupted, resulting in performance reduction. Thus, an external input signal is used to specify up to which ordered candidates should not be provided with electric power. For example, the external signal specifies the second through the fifth candidates, the supply of electric power to the second through the fifth entries in accordance with the LRU candidate ordering is stopped, thereby resulting in reduction in consumed electric power.

As mentioned above, the power control priority setup circuit 901 determines a power disconnection priority order signal 920 and supplies it to the power disconnection control circuit 902.

The power disconnection control circuit 902 receives the replaced entry selection order information 512 from the replaced entry selection information generation circuit 502. The power disconnection control circuit 902 determines entries to be disconnected based on the replaced entry selection order information 512 and the power disconnection priority order signal 920, and supplies the determined entries as power supply control signals 921 corresponding to the M entries.

Each of the power supply control signals 921 is supplied to the power control circuit 802 of FIG. 8 for controlling the CAM part 602 and the RAM part 603 of the corresponding entry.

Next, one embodiment of a procedure of implementing the present invention will be described with reference to a flowchart of FIG. 10.

Figure 10:
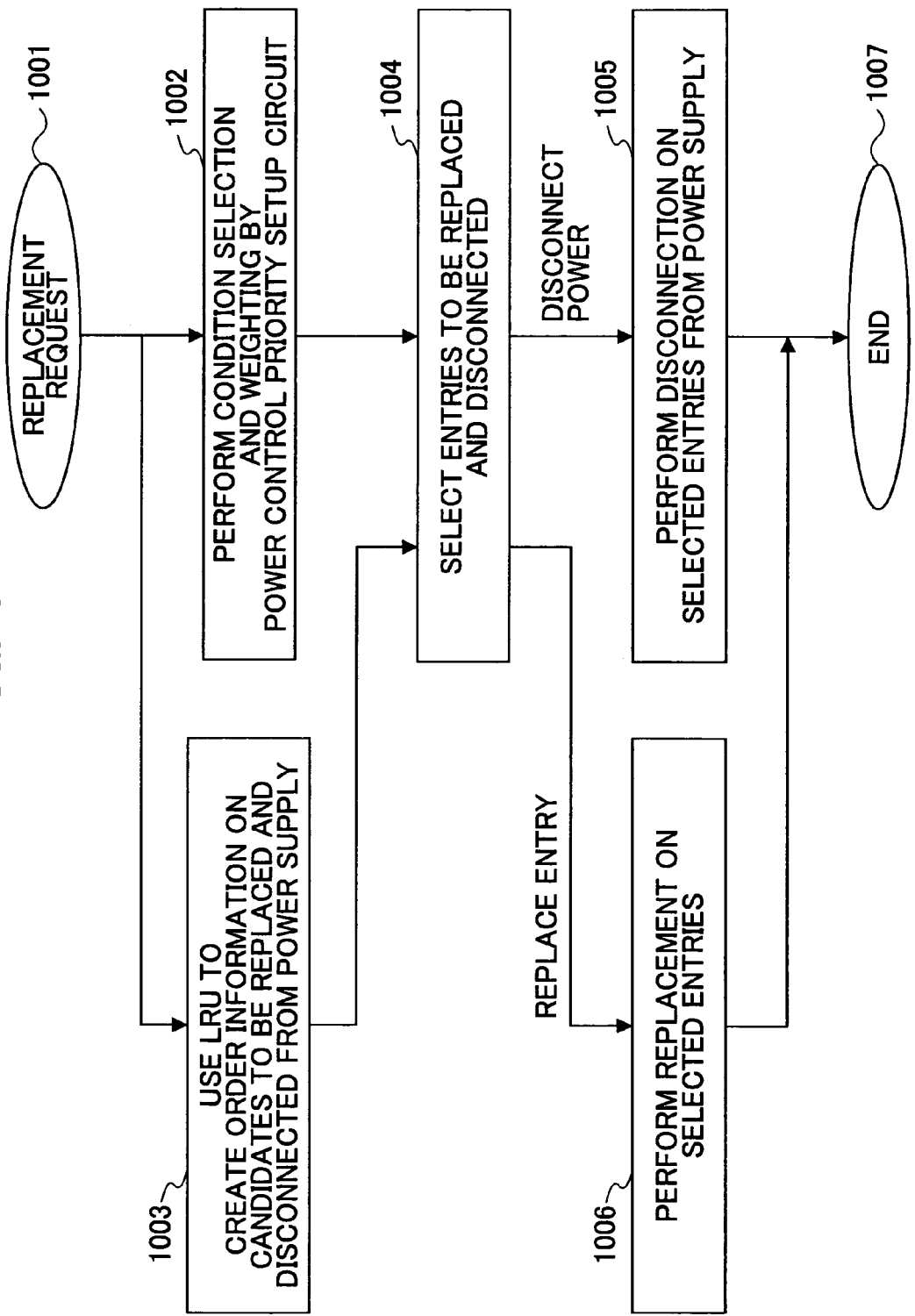
FIG. 10 is a flowchart of an exemplary method of implementing the present invention.

FIG. 10 is a flowchart of an exemplary method of implementing the present invention.

Referring to FIG. 10, at step 1001, a replacement request is generated in the memory management unit control circuit 301.

At step 1002, the power control priority setup circuit 901 generates a power disconnection priority order signal 920.

At the same time, at step 1003, the replaced entry selection information generation circuit 502 uses LRU algorithm to generate order information on candidates to be replaced and power supply disconnection candidates of TLB entries.

At step 1004, entries to be replaced and entries to be disconnected from the power supply are selected.

At step 1005, the power control circuit 802 interrupts the power supply to the selected entries to be disconnected.

At the same time, at step 1006, the memory management unit control circuit 301 replaces the TLB entries. In this replacement, the validbit of the replaced entries is set to be valid, and new data is written there. When the validbit is validated, electric power is supplied to the entries.

According to the present invention, since unused TLB entries or less frequently used TLB entries can be actively disconnected from power supply, it is possible to reduce unnecessary power consumption.

In addition, according to the present invention, since a plurality of selection conditions on power disconnection can be considered and the conditions can be weighted each other, TLB entries can be invalidated to achieve the optimal power control in consideration of various conditions. As a result, it is possible to reduce power consumption.

In addition, according to the present invention, the power control setup circuit can statically or dynamically provide entry optimal selection conditions for individual programs. As a result, it is possible to raise use efficiency of TLB.

The present invention is not limited to the specifically disclosed embodiments, and variations and modifications may be made without departing from the scope of the present invention.

What is claimed is:

1. A method of controlling electric power consumed for a translation lookaside buffer (TLB) within a central processing device having the TLB and an entry replacement mechanism wherein the TLB includes a plurality of entries and performs translation from a logical address to a physical address and the entry replacement mechanism replaces the entries of the TLB, the method comprising:
   selecting one or more entries among the plurality of entries of the TLB in accordance with one or more predefined criteria based on an output from the entry replacement mechanism, and
   stopping supply of electric power to the selected entries based on weight information,
   wherein the weight information is obtained by weighing individual information items including replacement order information on the plurality of entries, Page Table Entry PTE information, access interval information, external power reduction instruction signals and other priority determination conditions.

2. The method as claimed in claim 1, wherein the output from the entry replacement mechanism is the replacement order information on the plurality of entries.

3. The method as claimed in claim 2, wherein the replacement order information is based on use frequency of each of the plurality of entries.

4. The method as claimed in claim 2, further comprising:
   inputting control information for the entry selection to select second through n-th entries in accordance with the replacement order information.

5. The method as claimed in claim 2, wherein the predefined criteria comprises one or more of size information on memory pages used by the central processing device, priority level information on keeping an entry of an address translation table specified in unit of process executed by the central processing device, access interval information to the address translation table, the replacement order information and control information to select second through n-th entries in accordance with the replacement order information.

6. The method as claimed in claim 5, further comprising:
   inputting selectivity information and weight information,
   wherein the selectivity information is for determining whether to use as the predefined criteria one or more of the size information on memory pages used by the central processing device, the priority level information on keeping an entry of an address translation table specified in unit of process executed by the central processing device, the access interval information to the address translation table, the replacement order information and the control information to select second through n-th entries in accordance with the replacement order information, and the weight information is associated with weighting of the one or more information.

7. An apparatus for controlling electric power consumed for a translation lookaside buffer (TLB) within a central processing device having the TLB and an entry replacement mechanism wherein the TLB includes a plurality of entries and performs translation from a logical address to a physical address and the entry replacement mechanism replaces the entries of the TLB, the apparatus comprising:
   an entry selection part selecting one or more entries among the plurality of entries of the TLB in accordance with one or more predefined criteria based on an output from the entry replacement mechanism, and
   a power disconnection control part stopping supply of electric power to the selected entries based on weight information,
   wherein the weight information is obtained by weighing individual information items including replacement order information on the plurality of entries, Page Table Entry (PET) information, access interval information, external power reduction instruction signals and other priority determination conditions.

8. The apparatus as claimed in claim 7, wherein the output from the entry replacement mechanism is the replacement order information on the plurality of entries.

9. The apparatus as claimed in claim 8, wherein the replacement order information is based on use frequency of each of the plurality of entries.

10. The apparatus as claimed in claim 8, further comprising:
    an information input part inputting control information for the entry selection part to select second through n-th entries in accordance with the replacement order information.

11. The apparatus as claimed in claim 8, wherein the predefined criteria comprises one or more of size information on memory pages used by the central processing device, priority level information on keeping an entry of an address translation table specified in unit of process executed by the central processing device, access interval information to the address translation table, the replacement order information and control information to select second through n-th entries in accordance with the replacement order information.

12. The apparatus as claimed in claim 11, further comprising:
    an input part inputting selectivity information and weight information,
    wherein the selectivity information is for determining whether to use as the predefined criteria one or more of the size information on memory pages used by the central processing device, the priority level information on keeping an entry of an address translation table specified in unit of process executed by the central processing device, the access interval information to the address translation table, the replacement order information and the control information to select second through n-th entries in accordance with the replacement order information, and the weight information is associated with weighting of the one or more information.

13. A central processing device, comprising:

a translation lookaside buffer (TLB) having a plurality of entries and performing translation from a logical address to a physical address;

an entry replacement mechanism replacing one or more of the plurality of entries of the TLB; and a device including an entry selection part selecting one or more entries among the plurality of entries of the TLB in accordance with one or more predefined criteria based on an output from the entry replacement mechanism, and a power disconnection control part stopping supply of electric power to the selected entries based on weight information, wherein the weight information is obtained by weighing individual information items including replacement order information on the plurality of entries, Page Table Entry (PET) information, access interval information, eternal power reduction signals and other priority determination conditions.

* * * * *

UNITED STATES PATENT AND TRADEMARK OFFICE
CERTIFICATE OF CORRECTION

PATENT NO. : 7,418,553 B2  Page 1 of 1
APPLICATION NO. : 11/077148
DATED : August 26, 2008
INVENTOR(S) : Koichi Yoshimi It is certified that error appears in the above-identified patent and that said Letters Patent is hereby corrected as shown below:

Column 9, Line 39, change "PTE" to --(PTE)--.

Column 10, Line 25, change "(PET)" to --(PTE)--.

Column 12, Line 7, change "(PET)" to --(PTE)--.

Column 12, Line 8, change "eternal" to --external--.

Signed and Sealed this

Twenty-fifth Day of November, 2008

JON W. DUDAS
*Director of the United States Patent and Trademark Office*